United States Patent
Lee et al.

(10) Patent No.: US 10,373,653 B2
(45) Date of Patent: Aug. 6, 2019

(54) SEMICONDUCTOR DEVICE HAVING FIRST MEMORY SECTION AND SECOND MEMORY SECTION STACKED VERTICALLY ON EACH OTHER

(71) Applicant: Samsung Electronics Co., Ltd., Suwon-si, Gyeonggi-do (KR)

(72) Inventors: Kilho Lee, Busan (KR); Gwanhyeob Koh, Seoul (KR); Junhee Lim, Seoul (KR); Hongsoo Kim, Seongnam-si (KR); Chang-hoon Jeon, Goyang-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/854,551

(22) Filed: Dec. 26, 2017

(65) Prior Publication Data
US 2018/0358056 A1    Dec. 13, 2018

(30) Foreign Application Priority Data

Jun. 13, 2017  (KR) .................. 10-2017-0074370

(51) Int. Cl.
*G11C 5/06*    (2006.01)
*G11C 16/04*   (2006.01)
(Continued)

(52) U.S. Cl.
CPC .............. *G11C 5/06* (2013.01); *G11C 11/161* (2013.01); *G11C 16/0483* (2013.01);
(Continued)

(58) Field of Classification Search
CPC ..... G11C 5/06; G11C 11/161; G11C 16/0483; H01L 25/18; H01L 27/1157;
(Continued)

(56) References Cited

U.S. PATENT DOCUMENTS

| 7,280,397 | B2 * | 10/2007 | Scheuerlein ........... | G11C 14/00 365/154 |
| 7,336,519 | B2 * | 2/2008 | Ishii ...................... | B82Y 10/00 365/156 |

(Continued)

FOREIGN PATENT DOCUMENTS

| JP | 6151650 B2 | 6/2017 |
| KR | 20090009457 A | 1/2009 |

(Continued)

*Primary Examiner* — Vanthu T Nguyen
(74) *Attorney, Agent, or Firm* — Renaissance IP Law Group LLP

(57) ABSTRACT

A first memory section is disposed on a substrate. A second memory section is vertically stacked on the first memory section. The first memory section is provided between the substrate and the second memory section. The first memory section includes a flash memory cell structure, and the second memory section includes a variable resistance memory cell structure. The flash memory cell structure includes at least one cell string comprising a plurality of first memory cells connected in series to each other and a bit line on the substrate connected to the at least one cell string. The bit line is interposed vertically between the at least one cell string and the second memory section and connected to the second memory section.

17 Claims, 13 Drawing Sheets

(51) Int. Cl.
*G11C 11/16* (2006.01)
*H01L 25/18* (2006.01)
*H01L 27/22* (2006.01)
*H01L 27/11573* (2017.01)
*H01L 43/10* (2006.01)
*H01L 27/1157* (2017.01)
*H01L 27/11582* (2017.01)

(52) U.S. Cl.
CPC .......... *H01L 25/18* (2013.01); *H01L 27/1157* (2013.01); *H01L 27/11573* (2013.01); *H01L 27/222* (2013.01); *H01L 43/10* (2013.01); *H01L 27/11582* (2013.01)

(58) Field of Classification Search
CPC ......... H01L 27/11573; H01L 27/11582; H01L 27/222; H01L 43/10
See application file for complete search history.

(56) References Cited

U.S. PATENT DOCUMENTS

| | | | |
|---|---|---|---|
| 7,372,140 B2 | 5/2008 | Lee | |
| 7,423,898 B2 * | 9/2008 | Tanizaki | G11C 11/56 365/148 |
| 7,505,330 B2 * | 3/2009 | Pawlowski | G11C 7/1006 365/163 |
| 8,036,018 B2 | 10/2011 | Koh et al. | |
| 8,489,843 B2 * | 7/2013 | Leung | G06F 12/0246 711/170 |
| 8,716,805 B2 | 5/2014 | Fujita | |
| 8,735,902 B2 * | 5/2014 | Tang | H01L 27/11563 257/278 |
| 8,760,920 B2 | 6/2014 | Kim et al. | |
| 8,829,590 B2 | 9/2014 | Park | |
| 9,001,546 B2 * | 4/2015 | Chen | G11C 7/12 365/154 |
| 9,006,848 B2 | 4/2015 | Park | |
| 9,041,146 B2 | 5/2015 | Lee et al. | |
| 9,105,333 B1 * | 8/2015 | Hu | G11C 13/0069 |
| 9,208,883 B2 * | 12/2015 | Alsmeier | G11C 14/0018 |
| 9,478,739 B2 | 10/2016 | Kim | |
| 9,502,471 B1 * | 11/2016 | Lu | H01L 27/2481 |
| 9,530,822 B2 | 12/2016 | Shukh | |
| 9,535,831 B2 * | 1/2017 | Jayasena | G11C 11/005 |
| 9,543,512 B2 | 1/2017 | Ohba et al. | |
| 9,564,586 B2 | 2/2017 | Ha | |
| 9,627,438 B1 | 4/2017 | Satoh et al. | |
| 9,704,921 B2 | 7/2017 | Kim et al. | |
| 9,720,828 B2 | 8/2017 | Yoon et al. | |
| 9,780,144 B2 | 10/2017 | Seong et al. | |
| 10,008,265 B2 * | 6/2018 | Hsu | G11C 14/0018 |
| 2006/0145337 A1 | 7/2006 | Lee | |
| 2008/0083924 A1 * | 4/2008 | Song | H01L 29/78681 257/55 |
| 2009/0302394 A1 | 12/2009 | Fujita | |
| 2010/0032641 A1 | 2/2010 | Mikawa et al. | |
| 2011/0044093 A1 | 2/2011 | Koh et al. | |
| 2011/0228603 A1 * | 9/2011 | Takashima | G11C 14/00 365/185.08 |
| 2012/0092935 A1 | 4/2012 | Kim et al. | |
| 2013/0334632 A1 | 12/2013 | Park | |
| 2014/0117304 A1 | 5/2014 | Park | |
| 2014/0264679 A1 | 9/2014 | Lee et al. | |
| 2015/0207066 A1 | 7/2015 | Ohba et al. | |
| 2015/0249096 A1 | 9/2015 | Lupino et al. | |
| 2015/0249203 A1 | 9/2015 | Yoon et al. | |
| 2016/0005963 A1 | 1/2016 | Kim | |
| 2016/0118442 A1 | 4/2016 | Kim et al. | |
| 2016/0247565 A1 | 8/2016 | Perner et al. | |
| 2016/0329491 A1 | 11/2016 | Ha | |
| 2017/0110513 A1 | 4/2017 | Lee | |
| 2018/0294408 A1 | 10/2018 | Yasuda et al. | |

FOREIGN PATENT DOCUMENTS

| | | |
|---|---|---|
| KR | 101022580 B1 | 3/2011 |
| KR | 20130139692 A | 12/2013 |
| KR | 20150103527 A | 9/2015 |
| KR | 20160004525 A | 1/2016 |
| KR | 20160049299 A | 5/2016 |
| KR | 101642161 B1 | 8/2016 |
| KR | 20160131180 A | 11/2016 |
| KR | 20170045871 A | 4/2017 |

* cited by examiner

SEMICONDUCTOR DEVICE HAVING FIRST MEMORY SECTION AND SECOND MEMORY SECTION STACKED VERTICALLY ON EACH OTHER

CROSS-REFERENCE TO RELATED APPLICATION

This application claims priority under 35 U.S.C § 119 to Korean Patent Application No. 10-2017-0074370, filed on Jun. 13, 2017 in the Korean Intellectual Property Office, the disclosure of which is incorporated by reference herein in its entirety.

TECHNICAL FIELD

The present inventive concepts relate to a semiconductor device.

DISCUSSION OF RELATED ART

Semiconductor devices include memory devices and logic devices. The memory devices for storing data can be classified as volatile memory devices and nonvolatile memory devices. The volatile memory devices such as DRAM (Dynamic Random Access Memory) and SRAM (Static Random Access Memory) lose stored data when their power supply is interrupted. The nonvolatile memory devices such as PROM (programmable ROM), EPROM (erasable PROM), EEPROM (electrically EPROM), and Flash memory, do not lose stored data even when their power supply is interrupted.

Next generation semiconductor memory devices, for example, MRAM (magnetic random access memory), RRAM (resistive random access memory) and PRAM (phase change random access memory) are recently being developed to meet the trend of high performance and low power of the semiconductor memory devices. The next generation semiconductor memory devices include a material having characteristics that their resistance becomes different depending on applied electric current or voltage and their resistance is maintained even their electric current or voltage supply is interrupted.

SUMMARY

According to an exemplary embodiment of the present inventive concept, a semiconductor device is provided as follows. A first memory section is disposed on a substrate. A second memory section is vertically stacked on the first memory section. The first memory section is provided between the substrate and the second memory section. The first memory section comprises a flash memory cell structure, and the second memory section comprises a variable resistance memory cell structure. The flash memory cell structure comprises at least one cell string comprising a plurality of first memory cells connected in series to each other and a bit line on the substrate connected to the at least one cell string. The bit line is interposed vertically between the at least one cell string and the second memory section and connected to the second memory section.

According to an exemplary embodiment of the present inventive concept, a semiconductor device is provided as follows. A first memory section and a second memory section are sequentially stacked in a vertical direction on a top surface of a substrate. The first memory section comprises an electrode structure including gate electrodes that are stacked along the vertical direction on the top surface of the substrate, channel structures penetrating the electrode structure, and bit lines on the electrode structure and connected to the channel structures. The bit lines are interposed between the electrode structure of the first memory section and the second memory section. The second memory section comprises variable resistance memory cells connected to the bit lines.

BRIEF DESCRIPTION OF THE DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Figure 1:
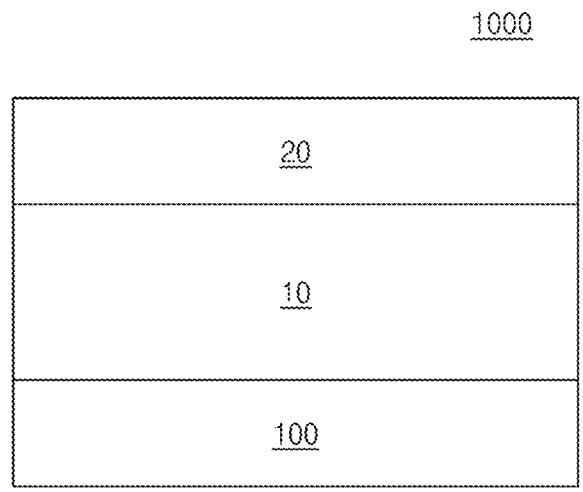
FIG. 1 illustrates a simplified cross-sectional view showing an arrangement inside a semiconductor device according to exemplary embodiments of the present inventive concepts.

Exemplary embodiments of the present inventive concepts will be described below in detail with reference to the accompanying drawings. However, the inventive concepts may be embodied in different forms and should not be construed as limited to the embodiments set forth herein. In the drawings, the thickness of layers and regions may be exaggerated for clarity. Like reference numerals may refer to the like elements throughout the specification and drawings.

FIG. 1 illustrates a simplified cross-sectional view showing an arrangement inside a semiconductor device according to exemplary embodiments of the present inventive concepts.

Referring to FIG. 1, a semiconductor device 1000 includes a first memory section 10 and a second memory section 20 on a substrate 100. The first memory section 10 is between the substrate 100 and the second memory section 20. The first memory section 10 and the second memory section 20 are sequentially stacked on the substrate 100 along a direction perpendicular to a top surface of the substrate 100. For example, the first memory section 10 and the second memory section 20 are vertically stacked on the top surface of the substrate 100. The first memory section 10 may include a flash memory cell structure, and the second memory section 20 may include a variable resistance memory cell structure. For example, the first memory section 10 may serve as a main memory, and the second memory section 20 may serve as a buffer memory.

Figure 2:
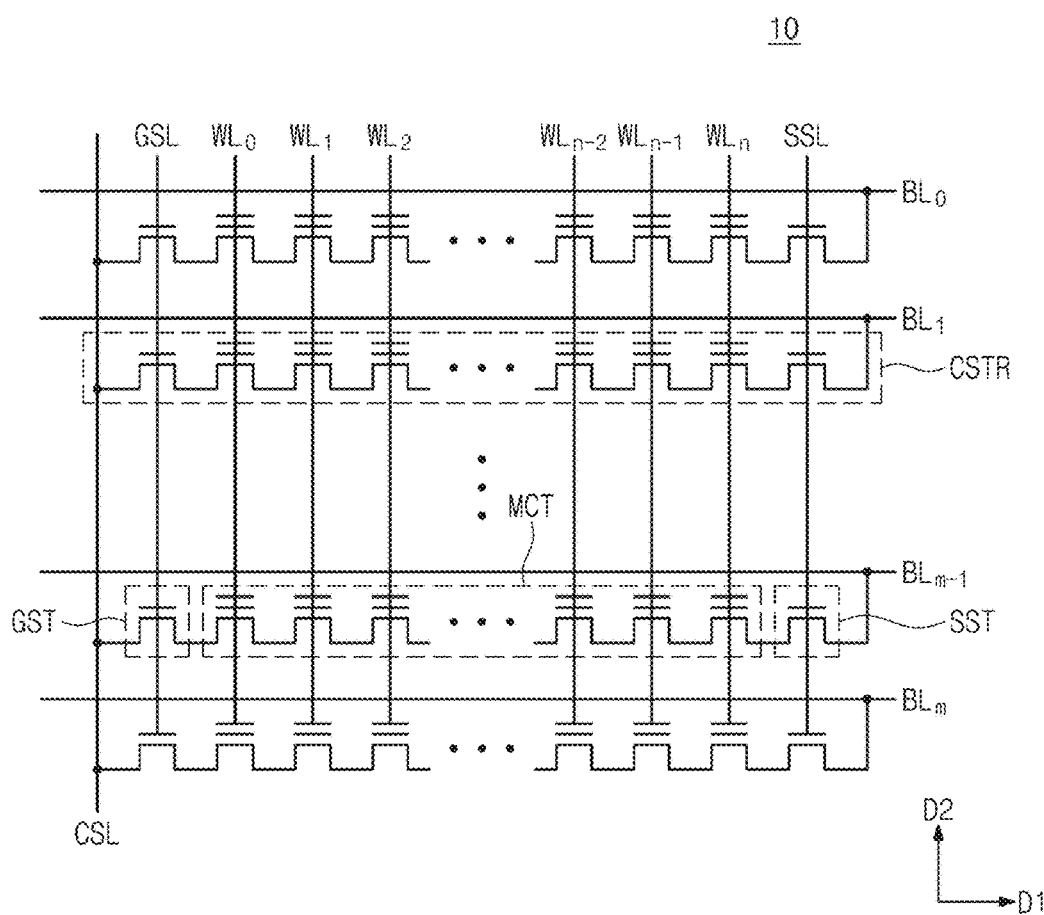
FIGS. 2 to 4 illustrate circuit diagrams showing a memory cell array on a first memory section of FIG. 1.
Figure 3:
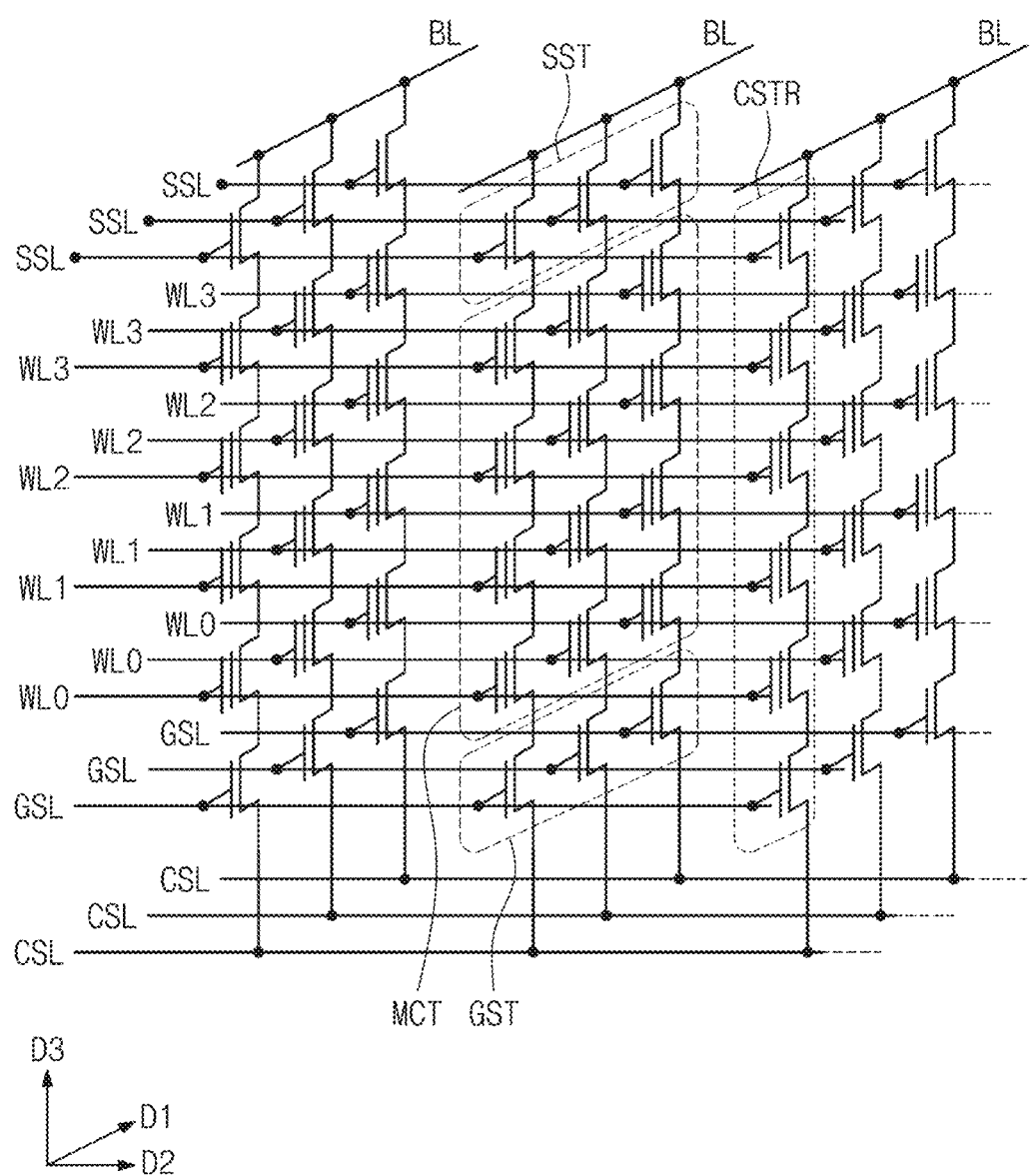
Figure 4:
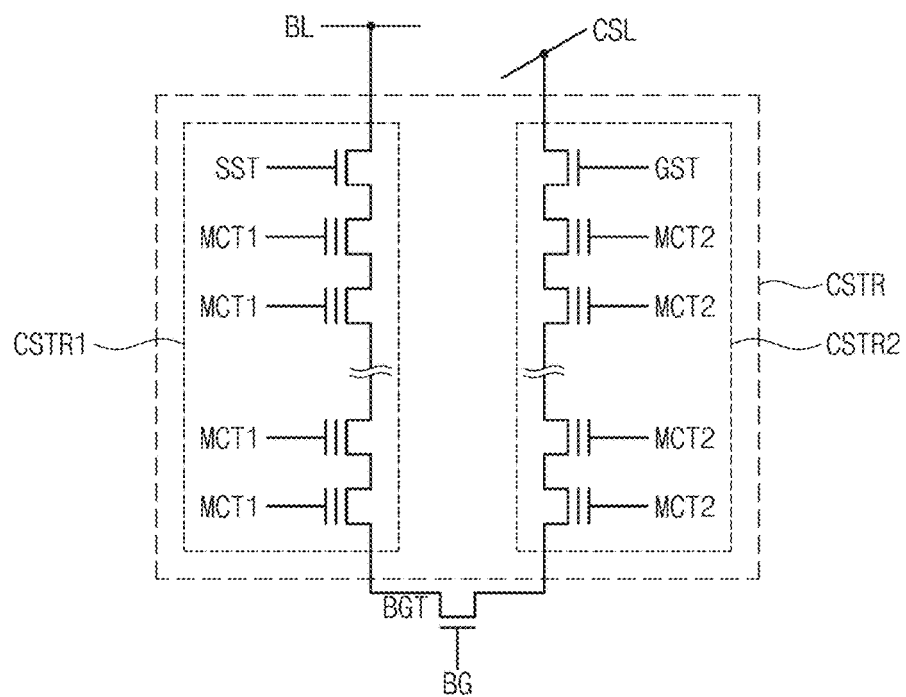

FIGS. 2 to 4 illustrate circuit diagrams showing a memory cell array on the first memory section of FIG. 1.

Referring to FIG. 2, in some embodiments, the first memory section 10 includes a two-dimensional NAND flash memory cell array. For example, the first memory section 10 includes a plurality of cell strings CSTR. Each of the plurality of cell strings CSTR includes a string select transistor SST connected to a string select line SSL, a plurality of memory cell transistors MCT correspondingly connected to a plurality of word lines WL0 to WLn (where n is a natural number), and a ground select transistor GST connected to a ground select line GSL. The string select transistor SST is connected to one of a plurality of bit lines BL0 to BLm (where m is a natural number), and the ground select transistor GST is connected to a common source line CSL. The bit lines BL0 to BLm extend in a first direction D1, and the string select line SSL, the word lines WL0 to WLn, and the ground select line GSL extend in a second direction D2 crossing the first direction D1. The first and second directions D1 and D2 may be parallel to the top surface of the substrate 100 of FIG. 1.

The substrate 100 of FIG. 1 is thereon with the string select line SSL, the word lines WL0 to WLn, and the ground select line GSL. The string select line SSL, the word lines WL0 to WLn, and the ground select line GSL may be used as gate electrodes of the string select transistor SST, the memory cell transistors MCT, and the ground select transistor GST, respectively. Each of the memory cell transistors MCT may include a data storage element.

Referring to FIG. 3, in some embodiments, the first memory section 10 includes a three-dimensional NAND flash memory cell array. For example, the first memory section 10 includes a common source line CSL, a plurality of bit lines BL, and a plurality of cell strings CSTR between the common source line CLS and the bit lines BL.

The common source line CSL may be a conductive thin layer disposed on the substrate 100 of FIG. 1 or an impurity region formed in the substrate 100 of FIG. 1. The bit lines BL may be conductive patterns (e.g., metal lines) disposed on the substrate 100 of FIG. 1 that are spaced apart from the substrate 100 along a third direction D3 perpendicular to the top surface of the substrate 100. The third direction D3 may be referred to as a "vertical direction" or "vertically". The bit lines BL may extend in the first direction D1 and be spaced apart from each other in the second direction D2. The cell strings CSTR are connected in parallel to one of the bit lines BL. The cell strings CSTR are connected in common to the common source line CSL. In some embodiments, the common source line CSL may be provided in plural, which may be two-dimensionally arranged on the substrate 100. The common source line CSL in plural may be supplied with the same voltage or electrically controlled independently of each other.

Each of the cell strings CSTR includes a ground select transistor GST connected to the common source line CSL, a string select transistor SST connected to the bit line BL, and a plurality of memory cell transistors MCT between the ground and string select transistors GST and SST. The ground select transistor GST, the string select transistor SST, and the memory cell transistors MCT may be connected in series to each other.

The common source line CSL may be connected in common to sources of the ground select transistors GST. The common source line CLS and the bit lines BL may be provided therebetween with a ground select line GSL, a plurality of word lines WL1 to WL3, and a string select line SSL, which may serve as gate electrodes of the ground select transistor GST, the memory cell transistors MCT, and the string select transistor SST, respectively. The ground select line GSL, the plurality of word lines WL0 to WL3, and the string select line SSL may be sequentially stacked along the third direction D3 on a top surface of the substrate 100. Each of the memory cell transistors MCT may include a data storage element.

Referring to FIG. 4, in some embodiments, the first memory section 10 includes a three-dimensional NAND flash memory cell array. For example, the first memory section 10 includes a common source line CSL, a bit line BL, and a cell string CSTR between the common source line CLS and the bit line BL. The common source line CSL may be a conductive thin layer (or a conductive pattern) disposed on the substrate 100 of FIG. 1, and the bit line BL may be a conductive pattern (e.g., a metal line) disposed on the substrate 100 of FIG. 1. The common source line CSL and the bit line BL may be spaced apart from the substrate 100 along a direction perpendicular to the top surface of the substrate 100 of FIG. 1.

The cell string CSTR is between the common source line CSL and the substrate 100 of FIG. 1 and between the bit line BL and the substrate 100 of FIG. 1. The cell string CSTR includes an upper string CSTR1 connected to the bit line BL and a lower string CSTR2 connected to the common source line CSL. The upper string CSTR1 is connected to the lower string CSTR2 through a back gate transistor BGT. The back gate transistor BGT is controlled by a back gate line BG provided on the substrate 100 of FIG. 1. The upper string CSTR1 includes a string select transistor SST connected to the bit line BL and a plurality of upper memory cell transistors MCT1 between the string select transistor SST and the back gate transistor BGT. The string select transistor SST and the upper memory cell transistors MCT1 are connected in series to each other. The lower string CSTR2 includes a ground select transistor GST connected to the common source line CSL and a plurality of lower memory cell transistors MCT2 between the ground select transistor GST and the back gate transistor BGT. The ground select transistor GST and the lower memory cell transistors MCT2 are connected in series to each other. Each of the upper and lower memory cell transistors MCT1 and MCT2 may include a data storage element.

Figure 5:
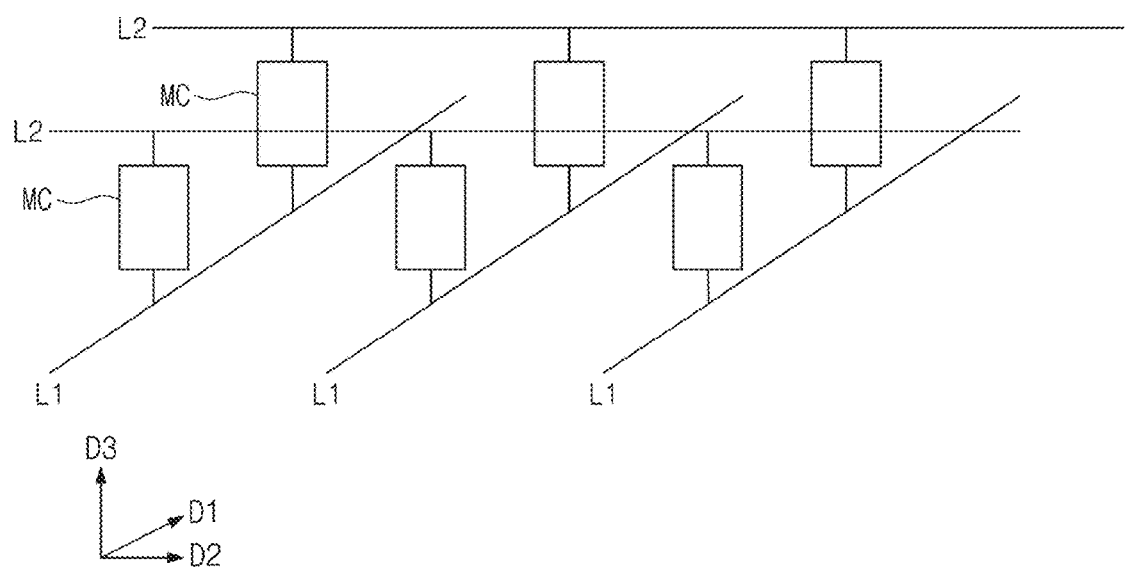
FIG. 5 illustrates a circuit diagram showing a memory cell array on a second memory section of FIG. 1.
Figure 6:
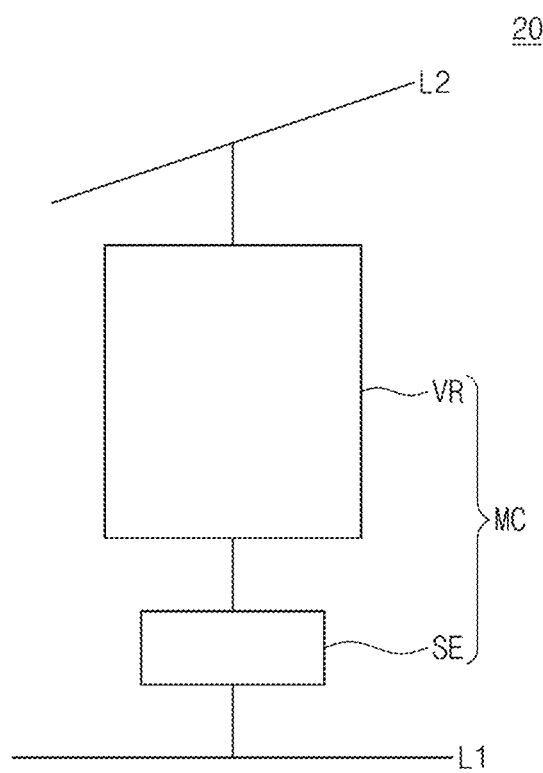
FIG. 6 illustrates a circuit diagram showing a unit memory cell on a second memory section of FIG. 1.

FIG. 5 illustrates a circuit diagram showing a memory cell array on the second memory section of FIG. 1, and FIG. 6 illustrates a circuit diagram showing a unit memory cell on the second memory section of FIG. 1.

Referring to FIG. 5, the second memory section 20 includes a variable resistance memory cell array. The variable resistance memory cell array may include an MRAM cell array, a PRAM cell array, or an RRAM cell array. For example, the second memory section 20 includes a plurality of first conductive lines L1, a plurality of second conductive lines L2 crossing the first conductive lines L1, and a plurality of memory cells MC at intersections between the first and second conductive lines L1 and L2 in a plan view. The substrate 100 of FIG. 1 is thereon with the first conductive lines L1, which extend in the first direction D1 and are spaced apart from each other in the second direction D2. The first conductive lines L1 are thereon with the second conductive lines L2, which extend in the second direction D2 and are spaced apart from each other in the first direction D1. The second conductive lines L2 may be positioned higher from the substrate 100 of FIG. 1 than the first conductive lines L1. Each of the memory cells MC is positioned at an intersection between one of the first conductive lines L1 and one of the second conductive lines L2 in a plan view, and may be connected to the one of the first and second conductive lines L1 and L2.

The first conductive lines L1 may correspond to the bit lines BL0 to BLm and BL discussed with reference to FIGS. 2 to 4. For example, the first conductive lines L1 may be the bit lines BL0 to BLm discussed with reference to FIG. 2. In this case, the memory cells MC may be correspondingly provided at intersections between the second conductive lines L2 and the bit lines BL0 to BLm in a plan view, and each of the memory cells MC may be connected to one of the bit lines BL0 to BLm and to one of the second conductive lines L2. Alternatively, the first conductive lines L1 may be the bit lines BL discussed with reference to FIG. 3. In this case, the memory cells MC may be correspondingly provided at intersections between the second conductive lines L2 and the bit lines BL in a plan view, and each of the memory cells MC may be connected to one of the bit lines BL and to one of the second conductive lines L2. Alternatively, one of the first conductive lines L1 may be the bit line BL discussed with reference to FIG. 4. In this case, the memory cells MC may be correspondingly provided at intersections between the second conductive lines L2 and the bit line BL in a plan view, and each of the memory cells MC may be connected to one of the plurality of the bit lines BL and to one of the second conductive lines L2. As such, the first memory section 10 and the second memory section 20 may share the bit lines BL0 to BLm and BL.

Referring to FIG. 6, each of the memory cells MC includes a variable resistance element VR and a select element SE. The variable resistance element VR and the select element SE are connected in series to each other between one of the first conductive lines L1 and one of the second conductive lines L2. For example, the variable resistance element VR is connected between the select element SE and the one of the second conductive lines L2, and the select element SE is connected between the variable resistance element VR and the one of the first conductive lines L1, but the present inventive concepts are not limited thereto. For example, the variable resistance element VR may be connected between the select element SE and one of the first conductive lines L1, and the select element SE may be connected between the variable resistance element VR and one of the second conductive lines L2.

The variable resistance element VR may include a data storage element. The variable resistance element VR may be switched between two resistance states when being supplied with an electrical pulse. The variable resistance element VR may be formed to have a thin-film structure whose electrical resistance is changed by a spin transferring phenomenon of an electric current passing through the variable resistance element VR. The variable resistance element VR may include a thin-film structure configured to exhibit a magneto-resistance property, and may include at least one ferromagnetic material or at least one anti-ferromagnetic material.

The select element SE may be configured to selectively control a current flow passing through the variable resistance element VR. For example, the select element SE may be configured to exhibit a non-linear I-V curve or a rectifying characteristic, and thus the electric current passing through each of the memory cells MC may be controlled to have a unidirectional property. Alternatively, the select element SE may include a non-linear resistor exhibiting a resistance property that varies depending on an applied voltage. For example, when resistance of the resistor is inversely proportional to an applied voltage, a selected cell under a relatively higher voltage may be in a lower resistance state allowing an electric current passing through the selected cell, while a non-selected cell under a relatively lower voltage may be in a high resistance state preventing electric current from passing through the non-selected cell. For example, the select element SE may be a device based on a threshold switching exhibiting a non-linear I-V curve (e.g., S-type I-V curve). The select element SE may be an OTS (Ovonic Threshold Switch) device exhibiting bidirectional characteristics.

Referring back to FIG. 5, although not shown, the second memory section 20 may include a plurality of third conductive lines, which are disposed on the second conductive lines L2, and additional memory cells, which are provided at corresponding intersections between the second conductive lines L2 and the third conductive lines in a plan view. In this case, the second memory section 20 may have a cross-point cell array structure in which the memory cells MC are three-dimensionally arranged along the first to third directions D1 to D3.

Figure 7A:
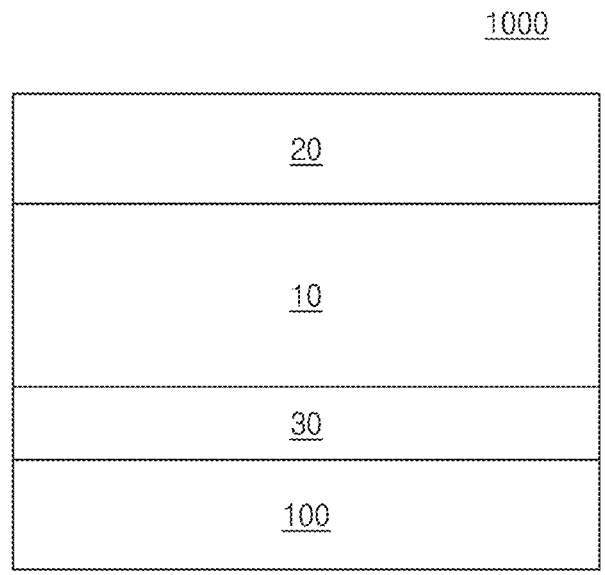
FIG. 7A illustrates a simplified cross-sectional view showing an arrangement inside a semiconductor device according to exemplary embodiments of the present inventive concepts.
Figure 7B:
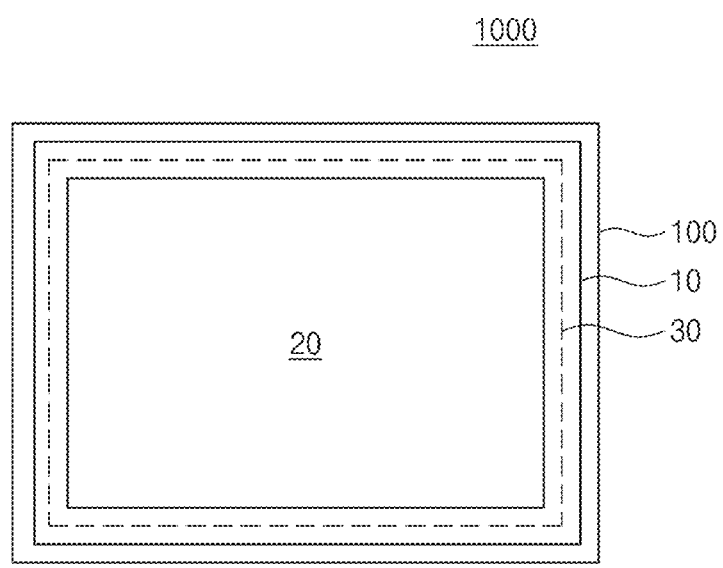
FIG. 7B illustrates a simplified plan view showing an arrangement inside the semiconductor device of FIG. 7A.

FIG. 7A illustrates a simplified cross-sectional view showing an arrangement inside a semiconductor device according to exemplary embodiments of the present inventive concepts. FIG. 7B illustrates a simplified plan view showing an arrangement inside the semiconductor device of FIG. 7A.

Referring to FIGS. 7A and 7B, the semiconductor device 1000 includes a first memory section 10 and a second memory section 20, and further includes a peripheral circuit section 30 between a substrate 100 and the first memory section 10. The peripheral circuit section 30, the first memory section 10, and the second memory section 20 are sequentially stacked on a top surface of the substrate 100 along a direction perpendicular to the top surface of the substrate 100.

The first memory section 10 may include a plurality of first memory cells that are two- or three-dimensionally arranged on the substrate 100. The first memory cells may correspond to the memory cell transistors MCT, MCT1, and MCT2 discussed with reference to FIGS. 2 to 4. The second memory section 20 may include a plurality of second memory cells that are two- or three-dimensionally arranged on the substrate 100. The second memory cells may correspond to the memory cells MC discussed with reference to FIG. 5. For example, the second memory cells may each include the variable resistance element VR and the select element SE.

The peripheral circuit section 30 may include a memory controller that operates the first memory cells of the first memory section 10. The memory controller may include a row decoder, a page buffer, an I/O buffer, a control logic, a buffer RAM, etc. The buffer RAM may include a volatile memory device such as a dynamic-random-access memory (DRAM) device or a static-random-access memory (SRAM) device. The peripheral circuit section 30 may further include an additional memory controller that operates the second memory cells of the second memory section 20.

Figure 8A:
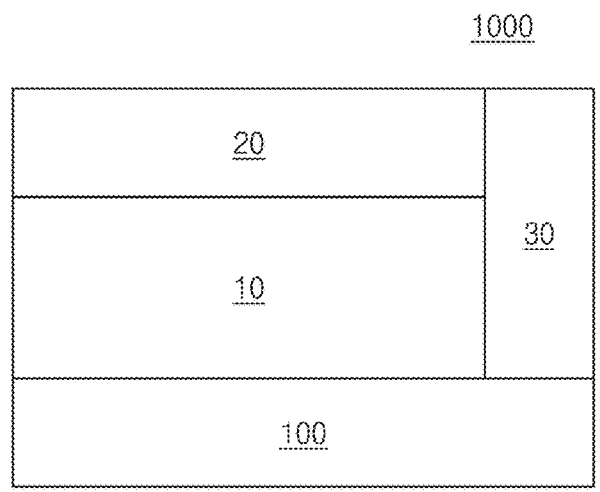
FIG. 8A illustrates a simplified cross-sectional view showing an arrangement inside a semiconductor device according to exemplary embodiments of the present inventive concepts.
Figure 8B:
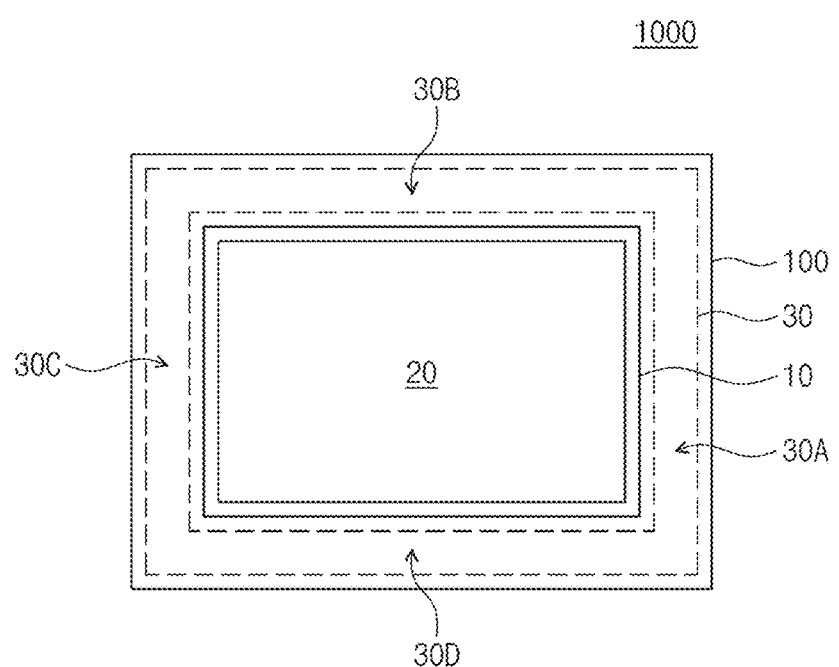
FIG. 8B illustrates a simplified plan view showing an arrangement inside the semiconductor device of FIG. 8A.

FIG. 8A illustrates a simplified cross-sectional view showing an arrangement inside a semiconductor device according to exemplary embodiments of the present inventive concepts. FIG. 8B illustrates a simplified plan view showing an arrangement inside the semiconductor device of FIG. 8A. The following semiconductor device is similar to that discussed with reference to FIGS. 7A and 7B, and thus the major differences between the semiconductor devices will be described below in the interest of brevity of description.

Referring to FIGS. 8A and 8B, the semiconductor device 1000 includes a first memory section 10 and a second memory section 20, and further includes a peripheral circuit section 30 on at least one side of the first memory section 10. The first memory section 10 and the peripheral circuit section 30 are disposed side by side on the substrate 100. The peripheral circuit section 30 is disposed adjacent to only one side of the first memory section 10 (30A), adjacent to two sides of the first memory section 10 (30A and 30B), adjacent to three sides of the first memory section 10 (30A, 30B, and 30C), or surrounding four sides of the first memory section 10 (30A, 30B, 30C, and 30C). According to the present embodiments, except for its relative arrangement, the peripheral circuit section 30 may be configured substantially the same as the peripheral circuit section 30 discussed with reference to FIGS. 7A and 7B.

Figure 9:
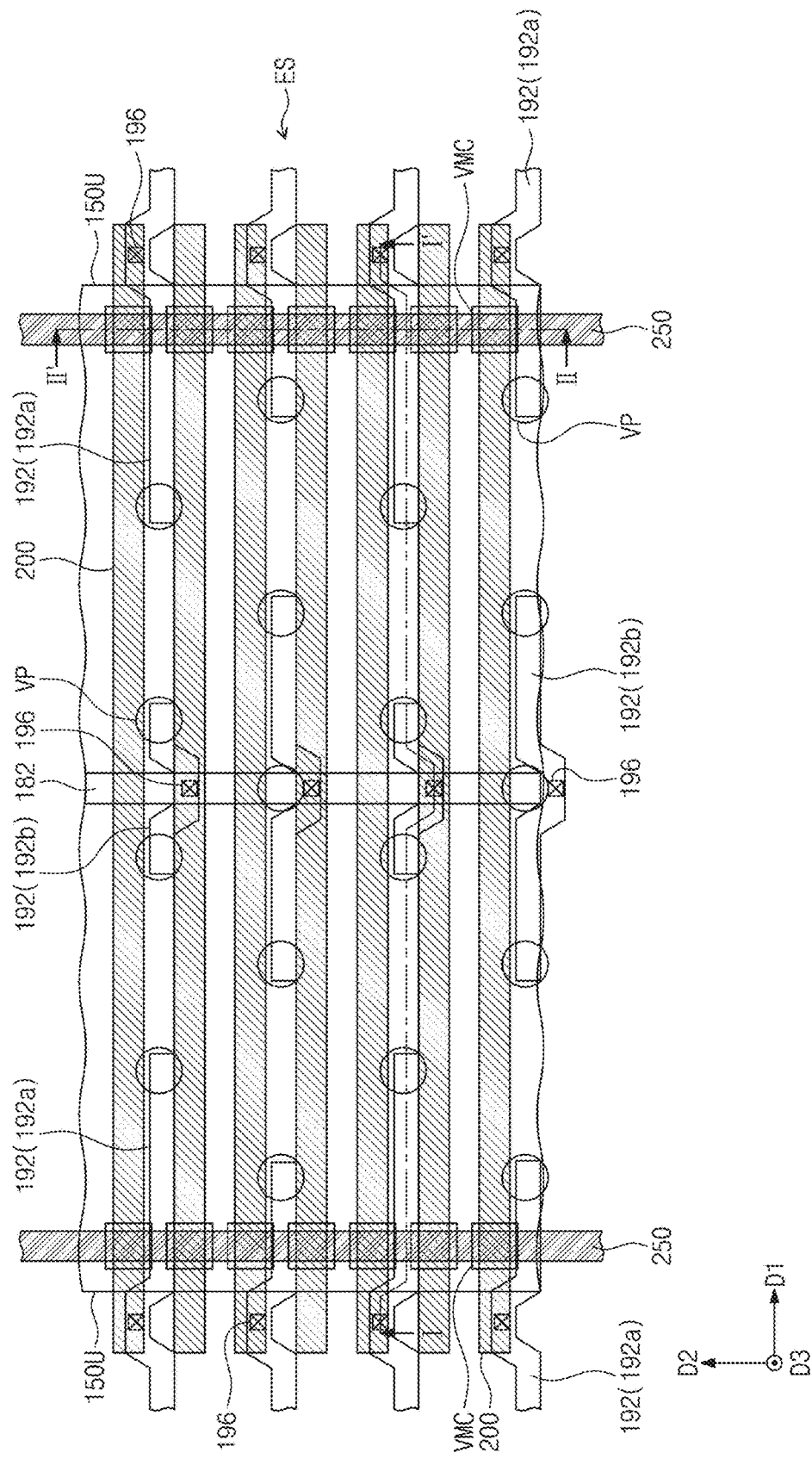
FIG. 9 illustrates a plan view showing a cell array of a semiconductor device according to exemplary embodiments of the present inventive concepts.
Figure 10:
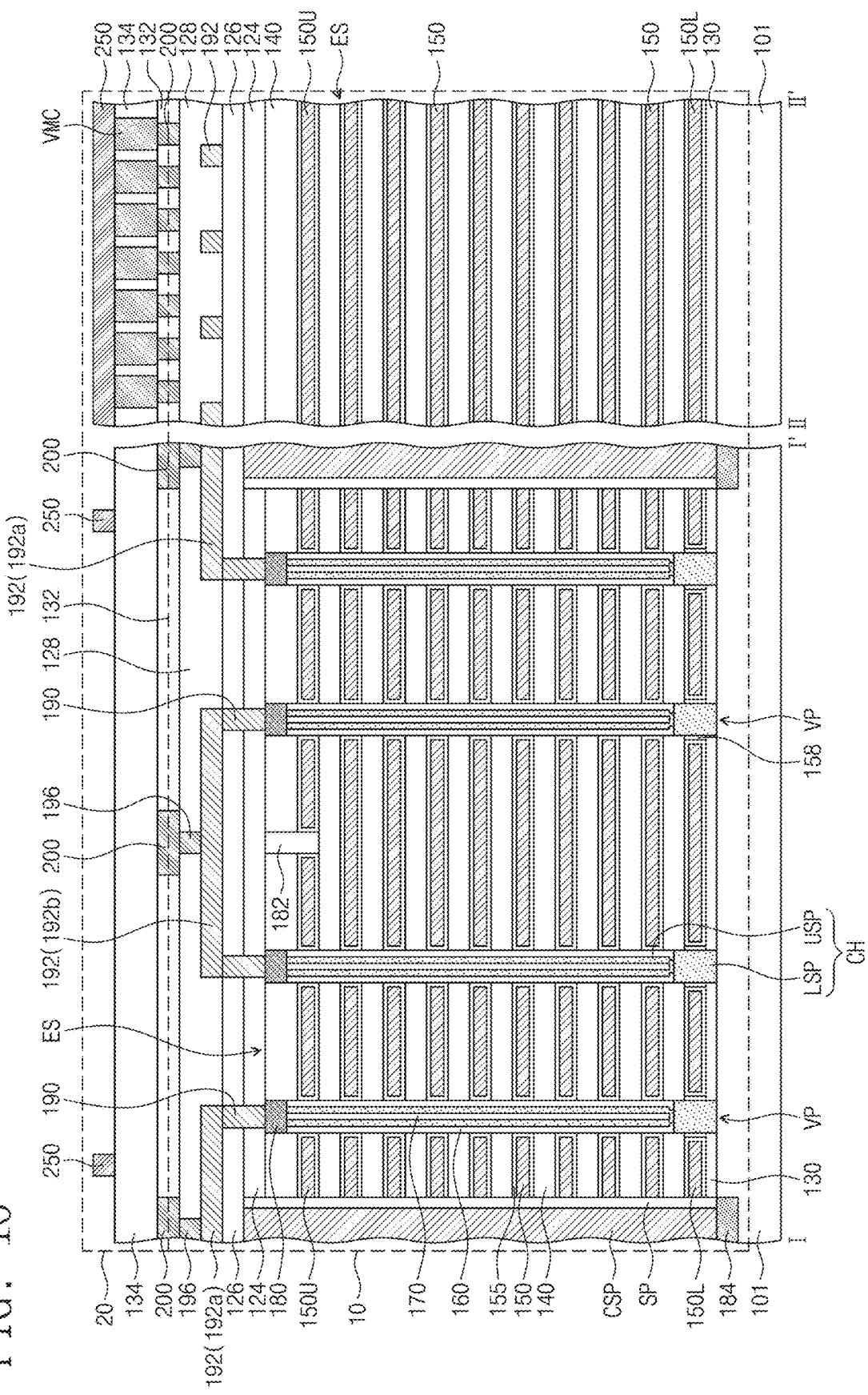
FIG. 10 illustrates a cross-sectional view taken along lines I-I' and II-II' of FIG. 9.

FIG. 9 illustrates a plan view showing a cell array of a semiconductor device according to exemplary embodiments of the present inventive concepts. FIG. 10 illustrates a cross-sectional view taken along lines I-I' and II-II' of FIG. 9.

Referring to FIGS. 9 and 10, a first memory section 10 and a second memory section 20 are vertically sacked on a lower structure 101. In some embodiments, the lower structure 101 may include a substrate 100 and the peripheral circuit section 30 discussed with reference to FIGS. 7A and 7B. In this case, the lower structure 101 may further include a semiconductor layer between the peripheral circuit section 30 and the first memory section 10, and the first memory section 10 and the second memory section 20 may be provided on the semiconductor layer. In other embodiments, the lower structure 101 may include the substrate 100 and the peripheral circuit section 30 discussed with reference to FIGS. 8A and 8B. In this case, the first memory section 10 and the second memory section 20 may be provided directly on the substrate 100.

The first memory section 10 may include a three-dimensional NAND flash memory cell structure provided on the lower structure 101. For example, an electrode structure ES is on the lower structure 101. The electrode structure ES includes a plurality of gate electrodes 150L, 150, and 150U sequentially stacked on the lower structure 101 and a plurality of insulating layers 140 between the gate electrodes 150L, 150, and 150U. The gate electrodes 150L, 150, and 150U and the insulating layers 140 are alternately and repeatedly stacked on the lower structure 101. The insulating layers 140 may electrically insulate the gate electrodes 150L, 150, and 150U from each other. A topmost gate electrode 150U of the gate electrodes 150L, 150, and 150U includes two uppermost gate electrodes that are horizontally spaced apart from each other. The two uppermost gate electrodes of the topmost gate electrode 150U are separated from each other by a separation insulating pattern 182 that extends in the second direction D2 therebetween. A buffer insulating layer 130 is interposed between the lower structure 101 and a lowermost gate electrode 150L of the gate electrodes 150L, 150 and 150U.

The insulating layers 140 may have substantially the same thickness, or at least one of the insulating layers 140 may be thicker than the others. The buffer insulating layer 130 may be thinner than the insulating layers 140. The insulating layers 140 may include a silicon oxide layer or a low-k dielectric layer, and the buffer insulating layer 130 may include an insulating material (e.g., a silicon oxide layer). The gate electrodes 150L, 150, and 150U may include metal or metal nitride. The separation insulating pattern 182 may include an insulating material (e.g., a silicon oxide layer).

The lower structure 101 is thereon with a plurality of vertical patterns VP that penetrate the electrode structure ES. Each of the vertical patterns VP penetrates the electrode structure ES and is in contact with the lower structure 101. When the lower structure 101 includes the substrate 100 and the peripheral circuit section 30 discussed with reference to FIGS. 7A and 7B, each of the vertical patterns VP penetrates the electrode structure ES and is in contact with the semiconductor layer of the lower structure 101. When the lower structure 101 includes the substrate 100 and the peripheral circuit section 30 discussed with reference to FIGS. 8A and 8B, each of the vertical patterns VP penetrates the electrode structure ES and is in contact with the substrate 100. As viewed in plan, the vertical patterns VP are arranged in a zigzag manner along the second direction D2.

Each of the vertical patterns VP includes a channel structure CH that protrudes upward from the lower structure 101. The channel structure CH may include a plurality of channel structures. For example, the channel structure CH includes a lower semiconductor pattern LSP, which penetrates a lower portion of the electrode structure ES and is connected to the lower structure 101 (e.g., the semiconductor layer of the lower structure 101 or the substrate 100), and an upper semiconductor pattern USP, which penetrates an upper portion of the electrode structure ES and is connected to the lower semiconductor pattern LSP. The upper semiconductor pattern USP has a closed bottom end that is in contact with the lower semiconductor pattern LSP. The upper semiconductor pattern USP may have a hollow pipe shape or a macaroni shape. The upper semiconductor pattern USP may be an impurity-doped semiconductor or an impurity-undoped intrinsic semiconductor. The lower semiconductor pattern LSP may include a semiconductor material whose conductivity is the same as that of the semiconductor layer (or the substrate 100) of the lower structure 101. The lower semiconductor pattern LSP may have a pillar shape that protrudes from the lower structure 101. The lowermost gate electrode 150L is adjacent to the lower semiconductor pattern LSP, and the other gate electrodes 150 and 150U are adjacent to the upper semiconductor pattern USP.

Each of the vertical patterns VP includes a buried insulating pattern 170 that fills an inside of the upper semiconductor pattern USP and a vertical insulator 160 that is between the upper semiconductor pattern USP and the electrode structure ES. The buried insulating pattern 170 may include, for example, silicon oxide. The vertical insulator 160 may have a macaroni shape or a pipe shape whose top and bottom ends are open. The vertical insulator 160 has a bottom surface in contact with the lower semiconductor pattern LSP.

The vertical insulator 160 may include a memory element of flash memory devices. Although not shown, the vertical insulator 160 may include a charge storage layer of flash memory devices. The vertical insulator 160 may include the charge storage layer and a tunnel insulating layer that are sequentially stacked. The tunnel insulating layer may be in direct contact with the upper semiconductor pattern USP, and the charge storage layer may be interposed between the tunnel insulating layer and the gate electrodes 150 and 150U. In some embodiments, the vertical insulator 160 may further include a blocking insulating layer between the charge storage layer and the gate electrodes 150 and 150U. The charge storage layer may include at least one silicon nitride layer and at least one silicon oxynitride layer. The tunnel insulating layer may include a material having a band gap greater than that of the charge storage layer. For example, the tunnel insulating layer may include a silicon oxide layer. The blocking insulating layer may include a material having a band gap greater than that of the charge storage layer. For example, the blocking insulating layer may include a silicon oxide layer, a silicon nitride layer, or a silicon oxynitride layer.

A gate dielectric pattern 158 is disposed between the lower semiconductor pattern LSP and the lowermost gate electrode 150L. The gate dielectric pattern 158 may include, for example, a silicon oxide layer.

A plurality of horizontal insulators 155 are on top and bottom surfaces of each of the gate electrodes 150L, 150, and 150U. Each of the horizontal insulators 155 extends between the vertical insulator 160 and each of the gate electrodes 150, and 150U, or between the gate dielectric pattern 158 and the lowermost gate electrode 150L. The horizontal insulators 155 may include a single thin layer or a plurality of thin layers. In some embodiments, the horizontal insulators 155 may each include a blocking insulating layer of charge trap-type flash memory transistors.

A plurality of conductive pads 180 are correspondingly on the vertical patterns VP. Each of the conductive pads 180 may be connected to the channel structure CH. The conductive pads 180 may include an impurity-doped semiconductor material or a conductive material.

The electrode structure ES is disposed between two adjacent common source regions of a plurality of common source regions 184. The common source regions 184 are in the lower structure 101 (e.g., the semiconductor layer of the lower structure 101 or the substrate 100) on opposite sides of the electrode structure ES and extend in the second direction D2. A plurality of side insulating spacers SP are correspondingly provided on opposite side surfaces of the electrode structure ES. The side insulating spacers SP may include, for example, silicon nitride. A plurality of common source plugs CSP are correspondingly provided on opposite sides of the electrode structure ES and are correspondingly coupled to the common source regions 184. The common source plugs CSP extend in the second direction D2 and are spaced apart from each other in the first direction D1 across the electrode structure ES. Each of the side insulating spacers SP is interposed between the electrode structure ES and one of the common source plugs CSP. The common source plugs CSP may include a conductive material.

An upper capping insulating layer 124 is provided on the electrode structure ES, covering a top surface of the electrode structure ES and top surfaces of the conductive pads 180. The upper capping insulating layer 124 has a top surface substantially coplanar with top surfaces of the common source plugs CSP. A first interlayer dielectric layer 126 is provided on the upper capping insulating layer 124, covering the top surfaces of the common source plugs CSP. The upper capping insulating layer 124 may include an insulating material (e.g., silicon oxide). The first interlayer dielectric layer 126 may include an insulating material (e.g., silicon oxide).

A plurality of lower contacts 190 are correspondingly provided on the conductive pads 180. Each of the lower contacts 190 penetrates the first interlayer dielectric layer 126 and the upper capping insulating layer 124 to be connected to a corresponding one of the conductive pads 180. The lower contacts 190 may include a conductive material.

A plurality of subsidiary conductive lines 192 are provided on the first interlayer dielectric layer 126. The subsidiary conductive lines 192 may be arranged along the first and second directions D1 and D2 on the first interlayer dielectric layer 126. The subsidiary conductive lines 192 may each have a bar shape having a longitudinal axis in the first direction D1. The subsidiary conductive lines 192 include a plurality of first subsidiary conductive lines 192a and a plurality of second subsidiary conductive lines 192b. On the electrode structure ES, each of the first subsidiary conductive lines 192a crosses over a corresponding one of the common source plugs CSP (or of the common source regions 184), and each of the second subsidiary conductive lines 192b crosses over the separation insulating pattern 182.

The subsidiary conductive lines 192 may be connected through the lower contacts 190 to the vertical patterns VP. Each of the first subsidiary conductive lines 192a may electrically connect a corresponding one of the vertical patterns VP of the electrode structure ES to a corresponding one of vertical patterns of a neighboring electrode structure. Although not shown, the neighboring electrode structure may be spaced apart from the electrode structure ES across one of the common source plugs CSP. Each of the second subsidiary conductive lines 192b may electrically connect two vertical patterns of the vertical patterns VP to each other. The two vertical patterns are spaced apart from each other across the separation insulating pattern 182, and respectively penetrate the two uppermost gate electrodes of the uppermost gate electrode 150U. The subsidiary conductive lines 192 may include a conductive material. The first interlayer dielectric layer 126 is provided thereon with a second interlayer dielectric layer 128 that covers the subsidiary conductive lines 192. The second interlayer dielectric layer 128 may include an insulating material (e.g., silicon oxide).

A plurality of bit lines 200 are provided on the second interlayer dielectric layer 128. The bit lines 200 extend in the first direction D1 and may be spaced apart from each other in the second direction D2. The bit lines 200 may be connected through upper contacts 196 to the subsidiary conductive lines 192. For example, the upper contacts 196 are correspondingly provided on the subsidiary conductive lines 192. Each of the upper contacts 196 penetrates at least a portion of the second interlayer dielectric layer 128 to be connected to a corresponding one of the subsidiary conductive lines 192. Each of the upper contacts 196 is connected to a corresponding one of the bit lines 200. The upper contacts 196 may include a conductive material. The bit lines 200 may include a conductive material. The second interlayer dielectric layer 128 is provided thereon with a third interlayer dielectric layer 132 that covers the bit lines 200. The third interlayer dielectric layer 132 may have a top surface substantially coplanar with top surfaces of the bit lines 200. The third interlayer dielectric layer 132 may include an insulating material (e.g., silicon oxide).

The second memory section 20 may include a variable resistance memory cell structure. For example, the second memory section 20 includes a plurality of variable resistance memory cells VMC provided on the third interlayer dielectric layer 132. The variable resistance memory cells VMC are two-dimensionally arranged along the first and second directions D1 and D2 on the electrode structure ES, but the present inventive concepts are not limited thereto. As viewed in plan, the variable resistance memory cells VMC may be arranged in various configurations on the electrode structure ES. Each of the variable resistance memory cells VMC may be connected to a corresponding one of the bit lines 200. The second memory section 20 may share the bit lines 200 with the first memory section 10. The second memory section 20 may include a fourth interlayer dielectric layer 134 that is provided on the third interlayer dielectric layer 132 and covers the variable resistance memory cells VMC. The fourth interlayer dielectric layer 134 may have a top surface substantially coplanar with top surfaces of the variable resistance memory cells VMC. The fourth interlayer dielectric layer 134 may include an insulating material (e.g., silicon oxide). The variable resistance memory cells VMC will be further discussed in detail below with reference to FIGS. 13, 14A, and 14B.

The second memory section 20 may include a plurality of conductive lines 250 provided on the fourth interlayer dielectric layer 134. The conductive lines 250 extend in the second direction D2 and be spaced apart from each other in the first direction D1. The conductive lines 250 cross over the bit lines 200. The variable resistance memory cells VMC are correspondingly provided at intersections between the bit lines 200 and the conductive lines 250 in a plan view. The variable resistance memory cells VMC arranged in the second direction D2 are correspondingly connected to the bit lines 200, and are connected in common to a corresponding one of the conductive lines 250. The conductive lines 250 may include a conductive material. Although not shown, the second memory section 20 may further include additional conductive lines, which are on and run across the conductive lines 250, and additional variable memory cells, which may be correspondingly provided at intersections between the conductive lines 250 and the additional conductive lines in a plan view. In this case, the second memory section 20 may have a cross-point cell array structure in which the variable resistance memory cells VMC and the additional variable resistance memory cells are three-dimensionally arranged along the first to third directions D1 to D3.

Figure 11:
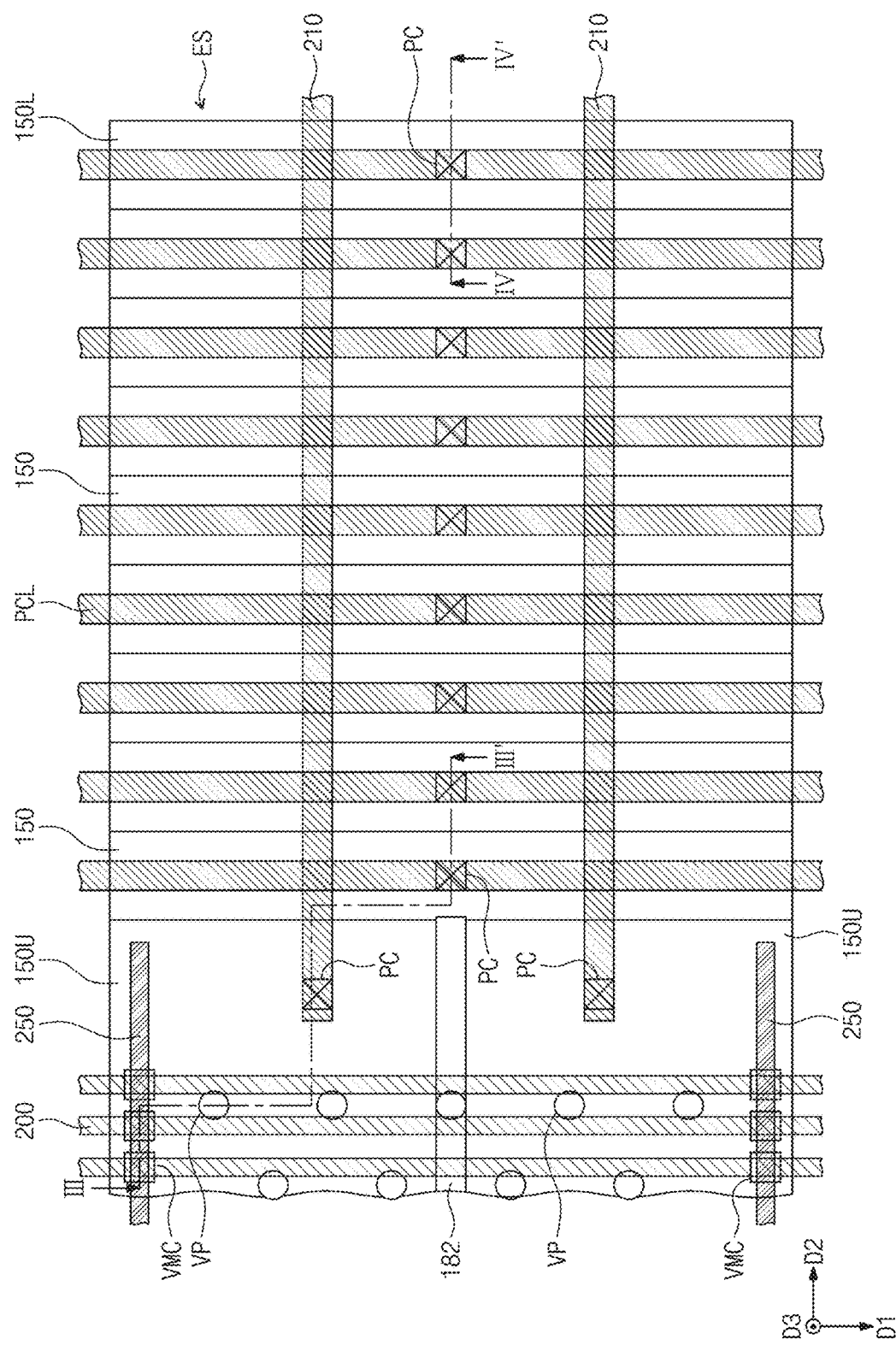
FIG. 11 illustrates a plan view showing a semiconductor device according to exemplary embodiments of the present inventive concepts.
Figure 12:
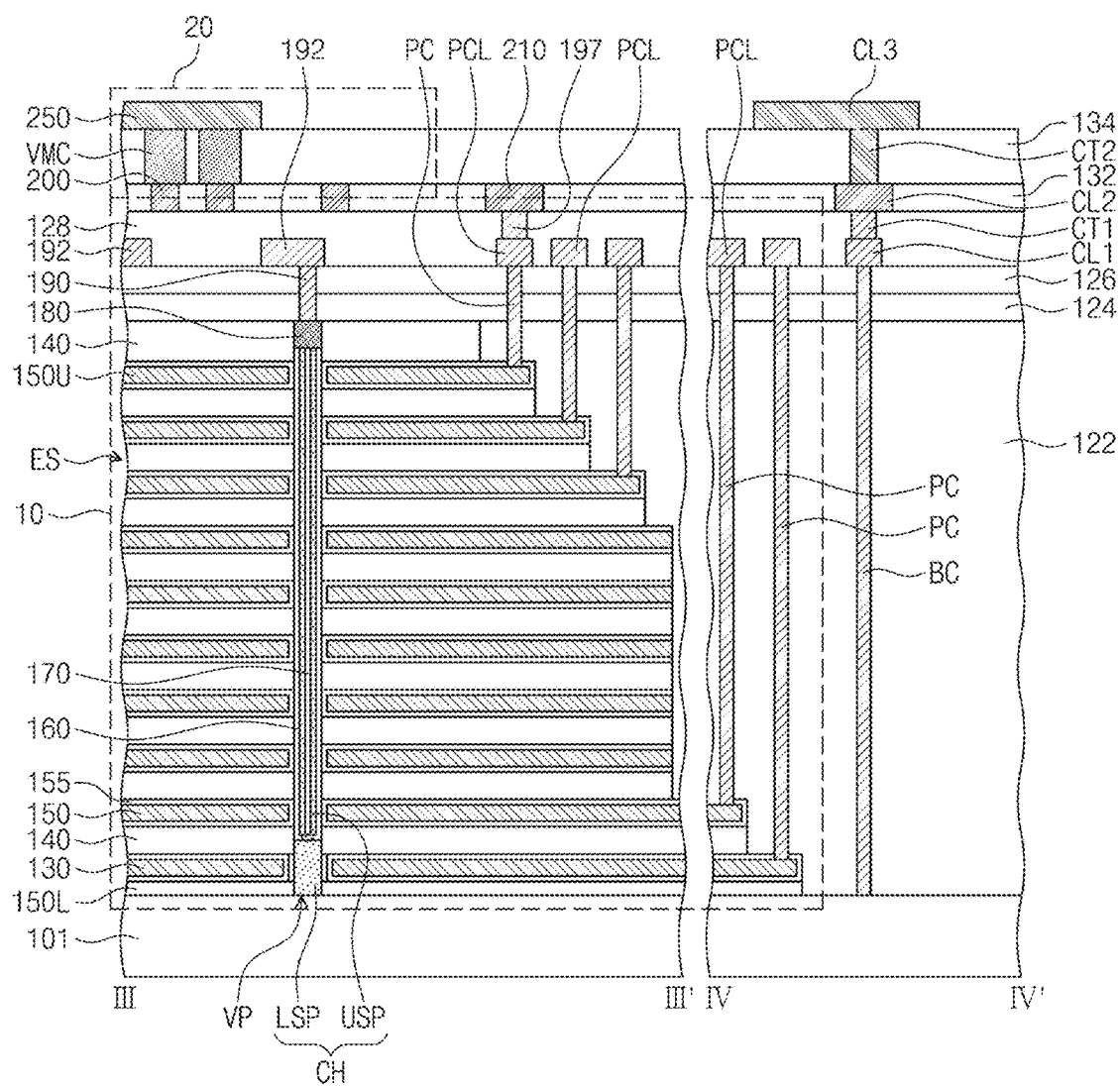
FIG. 12 illustrates a cross-sectional view taken along lines III-III' and IV-IV' of FIG. 11.

FIG. 11 illustrates a plan view showing a semiconductor device according to exemplary embodiments of the present inventive concepts. FIG. 12 illustrates a cross-sectional view taken along lines III-III' and IV-IV' of FIG. 11. The same technical features as those of the semiconductor device discussed with reference to FIGS. 9 and 10 may be omitted for brevity of description.

Referring to FIGS. 11 and 12, the electrode structure ES of the first memory section 10 extends in the second direction D2, and has a stepwise structure at its end portion. For example, each of the gate electrodes 150L, 150, and 150U extends in the second direction D2, and has an exposed end portion not covered with its overlying one of the gate electrodes 150L, 150, and 150U.

A lower capping insulating layer 122 is provided on the lower structure 101. The lower capping insulating layer 122 covers the stepwise-shape end portion of the electrode structure ES. The lower capping insulation layer 122 has a top surface substantially coplanar with a top surface of the electrode structure ES. For example, the top surface of the lower capping insulating layer 122 is substantially coplanar with that of an uppermost insulating layer of a plurality of insulating layers 140 in the electrode structure ES. The upper capping insulating layer 124 and the first to fourth interlayer dielectric layers 126, 128, 132, and 134 extend along the top surface of the lower capping insulating layer 122. The lower capping insulating layer 122 may include an insulating material (e.g., silicon oxide).

The first memory section 10 includes a plurality of lower pad contacts PC and a plurality of lower pad lines PCL. The lower pad contacts PC are correspondingly provided on the end portions of the gate electrodes 150L, 150, and 150U. The lower pad contacts PC may be connected to the gate electrodes 150L, 150, and 150U. Each of the lower pad contacts PC penetrates the first interlayer dielectric layer 126, the upper capping insulating layer 124, and at least a portion of the lower capping insulating layer 122, and is in contact with a corresponding one of the end portions of the gate electrodes 150L, 150, and 150U. The lower pad contacts PC and the lower contacts 190 have their top surfaces substantially coplanar with that of the first interlayer dielectric layer 126. The lower pad contacts PC may include a conductive material.

The lower pad lines PCL are provided on the first interlayer dielectric layer 126. The lower pad lines PCL are correspondingly connected to the lower pad contacts PC. The lower pad lines PCL may be connected through the lower pad contacts PC to the gate electrodes 150L, 150, and 150U. The lower pad lines PCL extend in the first direction D1 and are spaced apart from each other in the second direction D2. The lower pad lines PCL and the subsidiary conductive lines 192 are positioned at substantially the same height from a bottom surface of the lower structure 101. The lower pad lines PCL may include the same material as those of the subsidiary conductive lines 192. The second interlayer dielectric layer 128 covers the lower pad lines PCL and the subsidiary conductive lines 192.

The first memory section 10 includes a plurality of upper pad lines 210, which are provided on the second interlayer dielectric layer 128, and a plurality of upper pad contacts 197, which are correspondingly connected to the upper pad lines 210. The upper pad lines 210 extend in the second direction D2 and are spaced apart from each other in the first direction D1. The upper pad lines 210 may be connected respectively to the two uppermost gate electrodes of the uppermost gate electrode 150U. Each of the upper pad lines 210 may be connected through a corresponding one of the upper pad contacts 197 to a corresponding one of the two uppermost gate electrodes of the uppermost gate electrode 150U. The upper pad contacts 197 penetrate at least a portion of the second interlayer dielectric layer 128 to be connected to a corresponding one of the lower pad lines PCL. Each of the upper pad contacts 197 is connected to a corresponding one of the upper pad lines 210. The upper pad contacts 197 may be positioned at substantially the same height from the bottom surface of the lower structure 101 as those of the upper contacts 196 discussed with reference to FIGS. 9 and 10. For example, each of the upper pad contacts 197 may have a top surface substantially coplanar with a top surface of the second interlayer dielectric layer 128, and each of the upper contacts 196 may have a top surface substantially coplanar with the top surface of the second interlayer dielectric layer 128. The upper pad contacts 197 may include the same material as that of the upper contacts 196. The upper pad lines 210 and the bit lines 200 are provided at substantially the same level from the bottom surface of the lower structure 101, and may include the same material as each other. The bit lines 200 and the upper pad lines 210 penetrate the third interlayer dielectric layer 132. The top surface of the third interlayer dielectric layer 132 is substantially coplanar with top surfaces of the bit lines 200 and top surfaces of the upper pad lines 210. The fourth interlayer dielectric layer 134 covers the top surfaces of the bit lines 200 and the top surfaces of the upper pad lines 210.

Although not shown, the gate electrodes 150L, 150, and 150U may be connected through the lower pad contacts PC, the lower pad lines PCL, the upper pad contact 197, and the upper pad lines 210 to a row decoder of the peripheral circuit section 30 discussed with reference to FIGS. 7A, 7B, 8A, and 8B. The bit lines 200 may be connected to a page buffer of the peripheral circuit section 30.

A buried contact BC is provided on the lower structure 101. The buried contact BC is provided on one side of the electrode structure ES of the first memory section 10, and penetrates the lower capping insulating layer 122, the upper capping insulating layer 124, and the first interlayer dielectric layer 126. The buried contact BC may be connected to the peripheral circuit section 30 discussed with reference to FIGS. 7A, 7B, 8A, and 8B. The buried contact BC may be a single conductive contact or a plurality of conductive contacts that are connected to each other. The buried contact BC has a top surface at substantially the same height from the bottom surface of the lower structure 101 as those of the top surfaces of the lower pad contacts PC and those of the top surfaces of the lower contacts 190. The top surface of the first interlayer dielectric layer 126 may be substantially coplanar with that of the buried contact BC, those of the lower pad contacts PC, and those of the lower contacts 190. The buried contact BC may include a conductive material.

The first interlayer dielectric layer 126 is provided thereon with a first peripheral electric line CL1 connected to the buried contact BC. The first peripheral electric line CL1 is positioned at substantially the same height from the bottom surface of the lower structure 101 as those of the lower pad lines PCL and those of the subsidiary conductive lines 192. The first peripheral electric line CL1 may include the same material as those of the lower pad lines PCL and those of the subsidiary conductive lines 192. The second interlayer dielectric layer 128 covers the first peripheral electric line CL1. A first peripheral conductive contact CT1 penetrates at least a portion of the second interlayer dielectric layer 128 to be connected to the first peripheral electric line CL1. The first peripheral conductive contact CT1 is positioned at substantially the same height from the bottom surface of the lower structure 101 as that of the upper pad contact 197 and those of the upper contacts 196. The first peripheral conductive contact CT1 may include the same material as that of the upper pad contact 197 and those of the upper contacts 196 (See also FIG. 10).

The second interlayer dielectric layer 128 is provided thereon with a second peripheral electric line CL2 connected to the first peripheral conductive contact CT1. The second peripheral electric line CL2 is positioned at substantially the same height from the bottom surface of the lower structure 101 as those of the bit lines 200 and those of the upper pad lines 210. The second peripheral electric line CL2 may include the same material as those of the bit lines 200 and those of the upper pad lines 210. The second peripheral electric line CL2 penetrates the third interlayer dielectric layer 132 to be connected to the first peripheral conductive contact CT1. For example, the third interlayer dielectric layer 132 surrounds the second peripheral electric line CL2. The second peripheral electric line CL2 has a top surface substantially coplanar with those of the bit lines 200, those of the upper pad lines 210, and that of the third interlayer dielectric layer 132. The fourth interlayer dielectric layer 134 covers the top surface of the second peripheral electric line CL2.

A second peripheral conductive contact CT2 penetrates the fourth interlayer dielectric layer 134 to be connected to the second peripheral electric line CL2. The second peripheral conductive contact CT2 is positioned at substantially the same height from the bottom surface of the lower structure 101 as those of the variable resistance memory cells VMC of the second memory section 20. The fourth interlayer dielectric layer 134 is provided thereon with a third peripheral electric line CL3 connected to the second peripheral conductive contact CT2. The third peripheral conducive line CL3 is positioned at substantially the same height from the bottom surface of the lower structure 101 as those of the conductive lines 250 of the second memory section 20. The third peripheral electric line CL3 and the second peripheral conductive contact CT2 may include the same material (e.g., copper) as each other. The third peripheral electric line CL3 and the second peripheral conductive contact CT2 are in contact with each other without an intervening layer therebetween.

Figure 13:
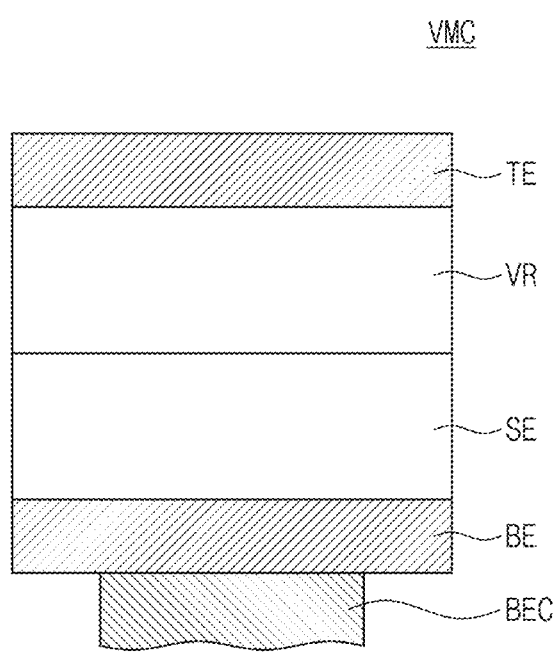
FIG. 13 illustrates a cross-sectional view showing a variable resistance memory cell according to exemplary embodiments of the present inventive concepts.
Figure 14A:
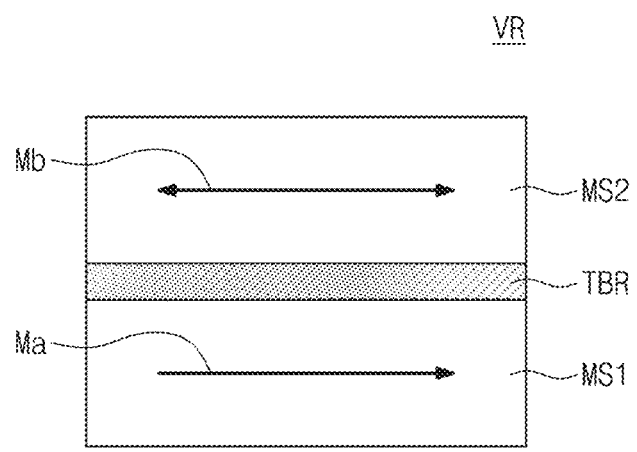
FIGS. 14A and 14B illustrate cross-sectional views each showing an example of a variable resistance element according to exemplary embodiments of the present inventive concepts.
Figure 14B:
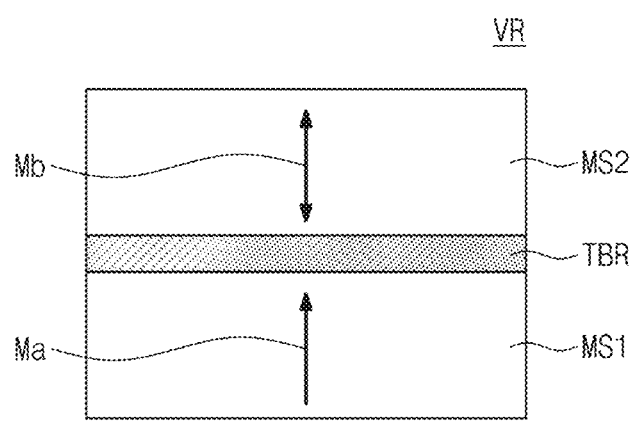

The variable resistance memory cells VMC are discussed in detail hereinafter with reference to FIGS. 13, 14A, and 14B. FIG. 13 illustrates a cross-sectional view showing a variable resistance memory cell according to exemplary embodiments of the present inventive concepts. FIGS. 14A and 14B illustrate cross-sectional views each showing an example of a variable resistance element according to exemplary embodiments of the present inventive concepts.

As discussed with reference to FIGS. 9 and 10, each of the variable resistance memory cells VMC is provided between and connected to one of the bit lines 200 and one of the conductive lines 250.

Referring to FIG. 13, each of the variable resistance memory cells VMC includes a variable resistance element VR and a select element SE. The variable resistance element VR and the select element SE are connected in series to each other between one of the bit lines 200 and one of the conductive lines 250. Each of the variable resistance memory cells VMC includes a bottom electrode BE adjacent to the one of the bit lines 200 and a top electrode TE adjacent to the one of the conductive lines 250. Each of the variable resistance memory cells VMC further includes a bottom electrode contact BEC between the one of the bit lines 200 and the bottom electrode BE. The select element SE is spaced apart from the top electrode TE across the variable resistance element VR. The variable resistance element VR is spaced apart from the bottom electrode BE across the select element SE. In other embodiments, differently from that shown in FIG. 13, the select element SE may be spaced apart from the bottom electrode BE across the variable resistance element VR, and the variable resistance element VR may be spaced apart from the top electrode TE across the select element SE. The top electrode TE, the bottom electrode BE, and the bottom electrode contact BEC may include metal or conductive metal nitride.

For example, the select element SE may include a diode exhibiting a rectifying property such as a silicon diode or an oxide diode. In this case, the select element SE may include a silicon diode in which p-type Si and n-type Si are joined together or an oxide diode in which p-type NiOx and n-type TiOx, or p-type CuOx and n-type TiOx, are joined together. In other embodiments, the select element SE may include an oxide material, for example, ZnOx, MgOx, or AlOx, which has high resistance preventing electric current flow at a specific voltage or less and low resistance allowing electric current flow at the specific voltage or more. In certain embodiments, the select element SE may be an OTS (Ovonic Threshold Switch) device exhibiting bidirectional characteristics. In this case, the select element SE may include a chalcogenide material in substantially amorphous state. In this description, the substantially amorphous state need not exclude the presence of a locally crystalline grain boundary or a locally crystalline portion. The chalcogenide material may include a compound having one or more of Te and Se, which are chalcogen elements, and one or more of Ge, Sb, Bi, Al, Pb, Sn, Ag, As, S, Si, In, Ti, Ga, and P. For example, the chalcogenide material may include AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, or GeAsBiSe.

Referring to FIGS. 14A and 14B, the variable resistance element VR includes a first magnetic structure MS1, a second magnetic structure MS2, and a tunnel barrier pattern TBR between the first and second magnetic structures MS1 and MS2. The first magnetic structure MS1 may include a reference layer whose magnetization direction Ma is fixed in one direction, and the second magnetic structure MS2 may include a free layer whose magnetization direction Mb is switchable to parallel or anti-parallel to the magnetization direction Ma of the reference layer. Differently from those shown in FIGS. 14A and 14B, the first magnetic structure MS1 may include the free layer, and the second magnetic structure MS2 may include the reference layer.

Referring to FIG. 14A, the variable resistance element VR is a magnetic tunnel junction pattern having a horizontal (or longitudinal) magnetization. In this case, the magnetization directions Ma and Mb of the reference and free layers are substantially parallel to an interface between the tunnel barrier pattern TBR and the first magnetic structure MS1. For example, the reference and free layers may each include a ferromagnetic material. The reference layer may further include an anti-ferromagnetic material that fixes a magnetization direction of the ferromagnetic material.

Referring to FIG. 14B, the variable resistance element VR is a magnetic tunnel junction pattern having a perpendicular magnetization. In this case, the magnetization directions Ma and Mb of the reference and free layers may be substantially perpendicular to an interface between the tunnel barrier pattern TBR and the first magnetic structure MS1. For example, the reference and free layers may each include one or more of a perpendicular magnetic material (e.g., CoFeTb, CoFeGd, CoFeDy), a perpendicular magnetic material having an $L_{10}$ structure, CoPt of a hexagonal close packed (HCP) lattice structure, and a perpendicular magnetic structure. The perpendicular magnetic material having an $L_{10}$ structure may include one or more of FePt of an $L_{10}$ structure, FePd of an $L_{10}$ structure, CoPd of an $L_{10}$ structure, and CoPt of an $L_{10}$ structure. The perpendicular magnetization structure may include magnetic layers and non-magnetic layers that are alternately and repeatedly stacked. For example, the perpendicular magnetization structure may include (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n (where n is the stack number). Herein, the reference layer may have a thickness greater than that of the free layer or have a coercive force greater than that of the free layer.

Figure 15:
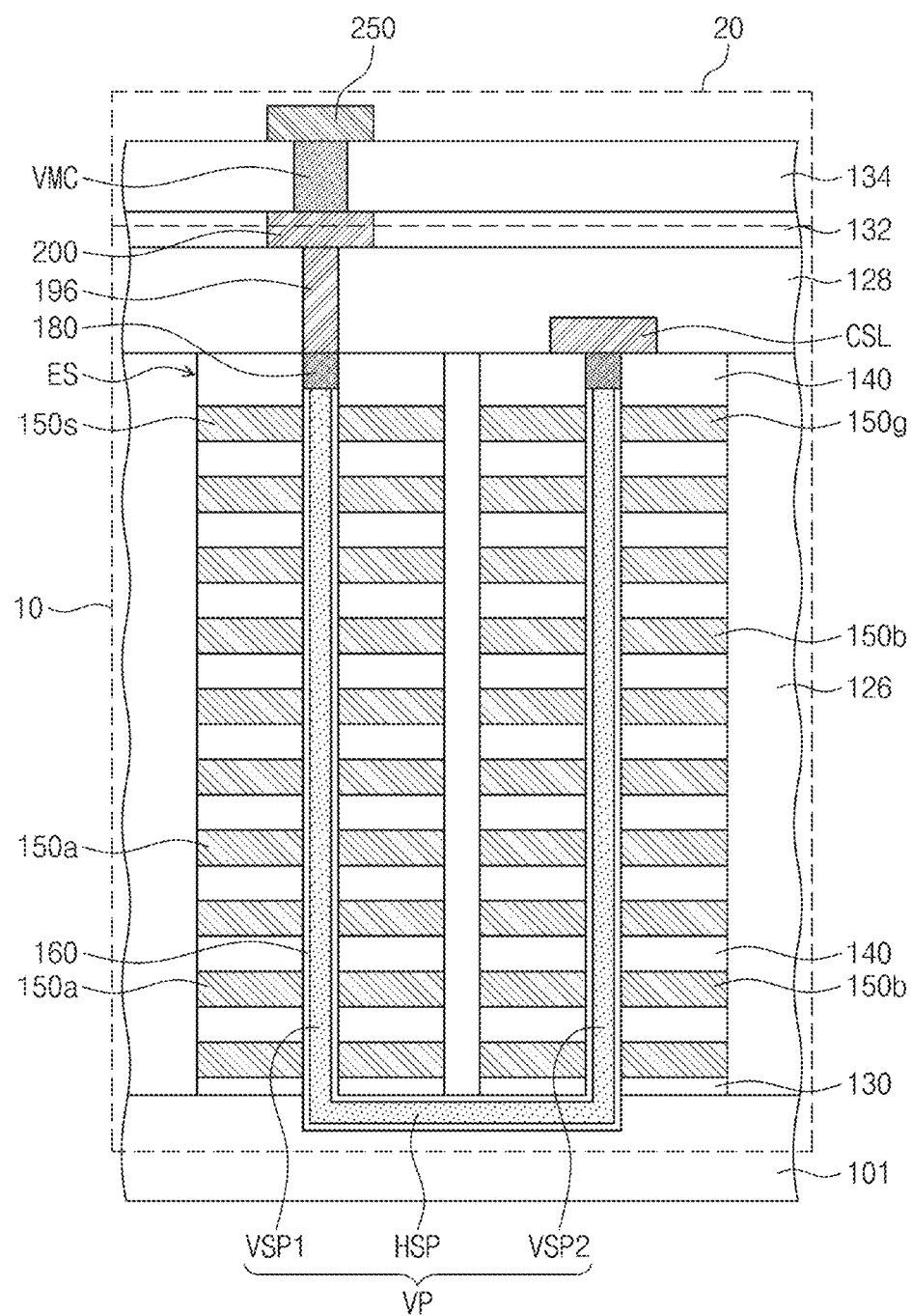
FIG. 15 illustrates a cross-sectional view showing a cell array of a semiconductor device according to exemplary embodiments of the present inventive concepts.

FIG. 15 illustrates a cross-sectional view showing a cell array of a semiconductor device according to exemplary embodiments of the present inventive concepts. Like reference numerals are used to refer to components the same as those of the cell array of the semiconductor device discussed with reference to FIGS. 9 and 10, and a difference is chiefly described for brevity of description.

Referring to FIG. 15, a first memory section 10 includes a three-dimensional NAND flash memory cell structure provided on a lower structure 101. For example, a bit line 200 is provided on the lower structure 101, and an electrode structure ES is provided between the lower structure 101 and the bit line 200. A common source line CSL is provided at a height between that of the electrode structure ES and that of the bit line 200. The vertical pattern VP penetrates the electrode structure ES and electrically connect the bit line 200 to the common source line CSL.

The electrode structure ES includes a plurality of upper cell gate electrodes 150a sequentially stacked on the lower structure 101 and a plurality of lower cell gate electrodes 150b sequentially stacked on the lower structure 101. The electrode structure ES further includes a plurality of select gate electrodes that are disposed on the upper cell gate electrodes 150a and the lower cell gate electrodes 150b. The select gate electrodes may include a string select gate electrode 150s, which is between the bit line 200 and the upper cell gate electrodes 150a, and a ground select gate electrode 150g, which is between the common source line CSL and the lower cell gate electrodes 150b. The string select gate electrode 150s is horizontally spaced apart from the ground select gate electrode 150g. The upper cell gate electrodes 150a are between the lower structure 101 and the string select gate electrode 150s. The lower cell gate electrodes 150b are between the lower structure 101 and the ground select gate electrode 150g. The upper cell gate electrodes 150a may be horizontally spaced apart from the lower cell gate electrodes 150b.

The vertical pattern VP includes a first vertical semiconductor pattern VSP1, a second vertical semiconductor pattern VSP2, and a horizontal semiconductor pattern HSP. The first vertical semiconductor pattern VSP1 penetrates the string select gate electrode 150s and the upper cell gate electrodes 150a of the electrode structure ES. The second vertical semiconductor pattern VSP2 penetrates the ground select gate electrode 150g and the lower cell gate electrodes 150b of the electrode structure ES. A horizontal semiconductor pattern HSP lies below the electrode structure ES and connects the first vertical semiconductor pattern VSP1 to the second vertical semiconductor pattern VSP2. The second vertical semiconductor pattern VSP2 is connected to the common source line CSL, and the first vertical semiconductor pattern VSP1 is connected to the bit line 200. The horizontal semiconductor pattern HSP is provided between the lower structure 101 and the electrode structure ES, connecting the first vertical semiconductor pattern VSP1 and the second vertical semiconductor pattern VSP2 to each other. The second vertical semiconductor pattern VSP2 penetrates the lower cell gate electrodes 150b and the ground select gate electrode 150g to be connected to the common source line CSL, and the first vertical semiconductor pattern VSP1 penetrates the upper cell gate electrodes 150a and the string select gate electrode 150s to be connected to the bit line 200. The horizontal semiconductor pattern HSP extends to below the lower cell gate electrodes 150b from below the upper cell gate electrodes 150a, thereby connecting the first vertical semiconductor pattern VSP1 to the second vertical semiconductor pattern VSP2.

The vertical insulator 160 is interposed between the electrode structure ES and the vertical pattern VP. The vertical insulator 160 extends between the vertical pattern VP and the lower structure 101. The vertical insulator 160 may include a tunnel insulating layer, a charge storage layer, and a blocking insulating layer that sequentially cover an outer surface of the vertical pattern VP.

The conductive pads 180 may be correspondingly provided on the first vertical semiconductor pattern VSP1 and the second vertical semiconductor pattern VSP2. The conductive pads 180 may be connected to the vertical pattern VP. Although not shown, the lower structure 101 may be provided therein with a back gate transistor BGT, discussed with reference to FIG. 4, that selectively controls a current flow passing through the horizontal semiconductor pattern HSP of the vertical pattern VP.

The lower structure 101 is provided thereon with the first interlayer dielectric layer 126 that covers the electrode structure ES. The second interlayer dielectric layer 128 is provided on the first interlayer dielectric layer 126. The common source line CSL is provided in the second interlayer dielectric layer 128 and connected to one of the conductive pads 180 connected to the second vertical semiconductor pattern VSP2. The common source line CSL may be connected through the one of the conductive pads 180 to the second vertical semiconductor pattern VSP2.

The bit line 200 is provided on the second interlayer dielectric layer 128. The bit line 200 is connected through the upper contact 196 to a conductive pad 180 that is connected to the first vertical semiconductor pattern VSP1. The upper contact 196 penetrates the second interlayer dielectric layer 128 to be connected to the bit line 200. The bit line 200 is connected through the upper contact 196 and the conductive pad 180 to the first vertical semiconductor pattern VSP1. The second interlayer dielectric layer 128 is provided thereon with the third interlayer dielectric layer 132 that surrounds the bit lines 200. For example, the bit lines 200 penetrate the third interlayer dielectric layer 132.

The second memory section 20 includes a variable resistance memory cell structure. For example, the second memory section 20 includes the variable resistance memory cell VMC provided on the third interlayer dielectric layer 132. The variable resistance memory cell VMC is connected to the bit line 200. The second memory section 20 share the bit line 200 with the first memory section 10. The second memory section 20 includes the fourth interlayer dielectric layer 134 that is provided on the third interlayer dielectric layer 132 and surrounds the variable resistance memory cell VMC. For example, the variable resistance memory cell VMC penetrates the third interlayer dielectric layer 132. The second memory section 20 includes the conductive line 250 provided on the fourth interlayer dielectric layer 134. The variable resistance memory cell VMC is interposed between the bit line 200 and the conductive line 250, and is connected to the bit line 200 and the conductive line 250. The variable resistance memory cell VMC may include substantially the same structure as that discussed with reference to FIGS. 13, 14A, and 14B.

According to the present inventive concepts, a single substrate may include thereon a first memory section and a second memory section, which are vertically stacked and which have different operating characteristics from each other. The first and second memory sections may share bit lines. For example, the first memory section may include first memory cells correspondingly connected to the bit lines, and the second memory section may include second memory cells correspondingly connected to the bit lines. As a result, a semiconductor device may be easily provided to have high integration with a reduced vertical profile.

While the present inventive concepts have been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
   a first memory section on a substrate;
   a second memory section vertically stacked on the first memory section, wherein the first memory section is provided between the substrate and the second memory section,
   wherein the first memory section comprises a flash memory cell structure, and the second memory section comprises a variable resistance memory cell structure,
   wherein the flash memory cell structure comprises:
      a cell string comprising a plurality of first memory cells connected in series to each other and a string select transistor; and
      a bit line on the substrate connected through the string select transistor to the first memory cells of the cell string,
   wherein the variable resistance memory cell structure comprises a second memory cell,
   wherein the second memory cell comprises:
      a variable resistance element; and
      a select element,
      wherein the bit line is connected through the select element to the variable resistance element,
   wherein the select element is interposed between the bit line and the variable resistance element,
   wherein the bit line is interposed between the string select transistor and the select element of the second memory section,
   wherein the second memory section comprises a conductive line connected to the second memory cell, and
   wherein the second memory cell is positioned at a height from the substrate between the bit line and the conductive line.

2. The semiconductor device of claim 1,
   wherein the first memory section serves as a main memory, and the second memory section serves as a buffer memory.

3. The semiconductor device of claim 1,
   wherein the bit line extends in a first direction parallel to a top surface of the substrate,
   wherein the conductive line extends in a second direction parallel to the top surface of the substrate, the second direction crossing the first direction, and
   wherein the second memory cell is positioned at an intersection between the bit line and the conductive line in a plan view.

4. The semiconductor device of claim 1,
   wherein the variable resistance element and the select element are connected in series to each other between the bit line and the conductive line, and
   wherein the select element selectively controls a current flow passing through the variable resistance element.

5. The semiconductor device of claim 4,
   wherein the select element comprises a chalcogenide material in an amorphous state.

6. The semiconductor device of claim 4,
wherein the variable resistance element comprises a magnetic tunnel junction pattern.

7. The semiconductor device of claim 1, further comprising:
a peripheral circuit section on the substrate;
a peripheral conductive contact horizontally spaced apart from the second memory cell and positioned at the same height from the substrate as that of the second memory cell; and
a peripheral electric line horizontally spaced apart from the conductive line and positioned at the same height from the substrate as that of the conductive line,
wherein the peripheral electric line is connected through the peripheral conductive contact to the peripheral circuit section.

8. The semiconductor device of claim 7,
wherein the peripheral electric line and the peripheral conductive contact comprise the same material.

9. The semiconductor device of claim 7,
wherein the peripheral circuit section is interposed between the substrate and the first memory section.

10. The semiconductor device of claim 7,
wherein the first memory section and the peripheral circuit section are disposed side by side on the substrate.

11. The semiconductor device of claim 1,
wherein the flash memory cell structure of the first memory section comprises a two-dimensional NAND flash memory cell array or a three-dimensional NAND flash memory cell array, and
wherein the variable resistance memory cell structure of the second memory section comprises an MRAM cell array, a PRAM cell array, or an RRAM cell array.

12. A semiconductor device, comprising:
a first memory section and a second memory section that are sequentially stacked in a vertical direction on a top surface of a substrate,
wherein the first memory section comprises:
an electrode structure including a plurality of gate electrodes that are stacked along the vertical direction on the top surface of the substrate;
a plurality of channel structures penetrating the electrode structure; and
a plurality of bit lines on the electrode structure and connected to the plurality of channel structures,
wherein the plurality of bit lines are interposed between the electrode structure of the first memory section and the second memory section, and
wherein the second memory section comprises a plurality of variable resistance memory cells connected to the plurality of bit lines,
wherein each of the variable resistance memory cells comprises:
a variable resistance element; and
a select element,
wherein one of the bit lines is connected through the select element to the variable resistance element,
wherein the select element is interposed between one of the bit lines and the variable resistance element,
wherein the second memory section comprises a plurality of conductive lines connected to the plurality of variable resistance memory cells, and
wherein the plurality of variable resistance memory cells are positioned at a height from the substrate between that of the plurality of bit lines and that of the plurality of conductive lines.

13. The semiconductor device of claim 12,
wherein the variable resistance element and the select element are connected in series to each other between one of the plurality of bit lines and one of the plurality of conductive lines.

14. The semiconductor device of claim 13,
wherein the variable resistance element comprises at least one magnetic layer and at least one non-magnetic layer.

15. The semiconductor device of claim 14,
wherein the select element comprises a chalcogenide material in an amorphous state.

16. The semiconductor device of claim 12,
wherein each of the plurality of the channel structures penetrates the electrode structure and is connected to one of the plurality of the bit lines, and
wherein the plurality of the variable resistance memory cells are correspondingly connected to the plurality of the bit lines.

17. The semiconductor device of claim 16,
wherein the second memory section comprises a plurality of conductive lines, one of the plurality of conductive lines being connected in common to the plurality of the variable resistance memory cells.

* * * * *